United States Patent [19]

Rosenkranz et al.

[11] B 4,001,016

[45] Jan. 4, 1977

[54] POLYMERS WHICH CAN BE CROSS-LINKED BY PHOTOPOLYMERIZATION

[75] Inventors: Hans-Jürgen Rosenkranz, Krefeld; Hans Rudolph, Krefeld-Bochum; Erich Wolff; Harald von Rintelen, both of Leverkusen, all of Germany

[73] Assignee: Agfa-Gevaert Aktiengesellschaft, Leverkusen, Germany

[22] Filed: Dec. 9, 1974

[21] Appl. No.: 530,873

[44] Published under the second Trial Voluntary Protest Program on February 17, 1976 as document No. B 530,873.

Related U.S. Application Data

[63] Continuation-in-part of Ser. No. 256,162, May 23, 1972, abandoned.

[30] Foreign Application Priority Data

May 25, 1971 Germany .......................... 2125910

[52] U.S. Cl. ............................... 96/35.1; 96/115 P; 204/159.15; 204/159.22; 204/159.23
[51] Int. Cl.² ...................... G03C 5/00; G03C 1/68
[58] Field of Search ............ 96/115 P, 115 R, 35.1; 204/159.15, 159.16, 159.22, 159.23

[56] References Cited

UNITED STATES PATENTS

| | | | |
|---|---|---|---|
| 2,972,540 | 2/1961 | Saner et al. | 96/115 P |
| 2,976,294 | 3/1961 | Firestine | 96/115 P |
| 3,043,805 | 7/1962 | Burg | 96/115 P |
| 3,081,168 | 3/1963 | Leekley et al. | 96/115 R |
| 3,427,161 | 2/1969 | Laridon et al. | 204/159.23 |
| 3,486,891 | 12/1969 | Wilhelm et al. | 96/35.1 |
| 3,533,796 | 10/1970 | Lassig et al. | 96/115 R |
| 3,620,733 | 11/1971 | Steppan et al. | 96/115 R |
| 3,764,501 | 10/1973 | Hori et al. | 204/159.15 |
| 3,858,510 | 1/1975 | Kai et al. | 96/35.1 |

*Primary Examiner*—David Klein
*Assistant Examiner*—Edward C. Kimlin
*Attorney, Agent, or Firm*—Connolly and Hutz

[57] ABSTRACT

Relief or resist images can be produced by means of a photosensitive material including a photosensitive layer with a polymer as defined hereinafter containing vinyl groups capable of being cross-linked upon exposure to actinic light to yield unsoluble cross-linked products at the exposed areas while the polymer in the unexposed areas remain soluble.

2 Claims, No Drawings

POLYMERS WHICH CAN BE CROSS-LINKED BY PHOTOPOLYMERIZATION

This application is a continuation-in-part of U.S. application Ser. No. 256,162, filed May 23, 1972, by Hans-Jurgen Rosenkranz and others, entitled "Polymers Which Can Be Cross-Linked by Photopolymerisation," now abandoned.

This invention relates to a process for the production of relief or resist images and to a photosensitive material for performing the said process including a photosensitive layer with a polymer containing vinyl groups capable of being cross-linked upon exposure to actinic light to yield unsoluble cross-linked products at the exposed areas while the polymer in the unexposed areas remain soluble.

Light-sensitive layers of polymeric compounds which contain vinyl groups and which are capable of being cross-linked by vinyl polymerization initiated by photochemical means have acquired special interest for copying processes, mainly on account of their relatively high light-sensitivity. One of these polymers is a reaction product of a polymer carrying glycidyl groups with acrylic acid. However, these polymers have to be stabilized already during their preparation in order to prevent premature cross-linking. That stabilization strongly impairs the light-sensitivity of the final product.

Moreover, these polymers as well as virtually all other polymers cross-linked by photopolymerization, are characterized by an undesired sensitivity to oxygen which necessitates exposure in an inert gas atmosphere or through a covering foil.

It is among the objects of the present invention to provide polymer systems capable of being cross-linked by vinyl polymerization initiated by light, which would not have the disadvantages mentioned above.

We now have found a process for the production of photographic relief images or photoresists comprising the steps of imagewise exposing a light-sensitive material with a photocrosslinkable polymer layer on a support to actinic light to form an image of the photocrosslinked polymer in the layer, washing away the unexposed areas of the photosensitive layer to form a relief image of the photocross-linked polymeric material, wherein the photocrosslinkable layer comprises at least one photopolymerizable polymer which contains at least two recurring units of the following formula attached directly or through an organic bridge member to the polymer chain:

(I)      $CH_2\!=\!C\!-\!\overset{\overset{R^1}{\mid}}{\underset{\underset{O}{\parallel}}{C}}\!-\!N\!-\!\overset{R^2}{\underset{\mid}{CH_2}}\!-\!X\!-$ wherein
R$^1$ represents hydrogen or alkyl having up to 4 carbon atoms;
R$^2$ stands for hydrogen or alkyl having up to 8 carbon atoms;
X stands for —O—, —NH— or being a bridging member to the polymer chain

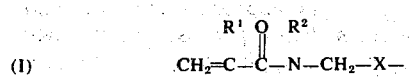

The light-sensitive polymers used according to the present invention have a molecular weight of at least 1000 in particular a molecular weight of between 10.000 and 100.000.

Polymers which contain the above recurring units at least twice per structural unit having a molecular weight of around 1,000 are preferred.

The light-sensitive polymers of the present invention are prepared by reacting compounds which contain Zerewitinoff-active hydrogen atoms, such as hydroxyl groups, carbamoyl groups, imide groups or amino groups, preferably polymers with a molecular weight >1000, mixed with vinyl compounds of the following formula:

(II)      $CH_2\!=\!\overset{\overset{R^1}{\mid}}{C}\!-\!\overset{\overset{O}{\parallel}}{C}\!-\!N\!-\!\overset{R^2}{\underset{\mid}{CH_2}}\!-\!OR^3$ wherein R$^1$ and R$^2$ have the above meaning and R$^3$ stands for hydrogen or alkyl having preferably up to 8 carbon atoms.

The reaction compounds are preferably reacted in dissolved form in the presence of an acidic catalyst, for example, a mineral acid, organic sulfonic acid or carboxylic acid, at temperatures of between −10° and +140°C, preferably at between +10° and +120°C.

Suitable polymers are, in principle, all those which contain, per molecule, at least two functional groups which are capable of reacting in the presence of acids with N-methylol groups and/or N-methylol ethers.

The molecular weight of the polymer reactants may vary within wide limits, depending somewaht on the intended application. Polymers with a molecular weight of over 1000 are preferably used.

The average molecular weight best suited for the intended application can be established in a simple way by a few tests.

Natural substances as well as synthetic high-molecular compounds are suitable. Suitable natural polymers are, for example, cellulose, starch or gelatin or processed derivatives of these natural substances such as e.g. partially esterified or etherified cellulose.

Suitable synthetic polymers include, for example, polyvinyl alcohols or copolymers of vinyl alcohol with any polymerizable monomers which do not react with the N-methylol or N-methylol ether groups of the compounds of the formula (II) to form reaction products containing vinyl groups, in particular with vinyl monomers, for example, with ethylene, propylene, butylene, butadiene, isoprene, vinyl chloride, vinylidene chloride; with vinyl esters, especially vinyl acetate or vinyl propionate; with vinyl ethers, e.g. vinyl propyl ether, vinyl isobutyl ether; with acrylic or methacrylic acid or their derivatives such as esters, especially with aliphatic alcohols having up to 5 carbon atoms, nitriles with maleic acid anhydride or with styrene.

Polycondenzation products with Zerewitinoff-active hydrogene, especially with alcoholic hydroxyl groups, are also suitable, for example, polyesters of polyvalent aliphatic or aromatic carboxylic acids with polyhydric alcohols; polyurethanes containing hydroxyl groups; or epoxide resins containing hydroxyl groups, such as are obtained, for example, by reacting polyvalent carboxylic acids, alcohols or amines with epihalohydrins, especially with epichlorohydrin.

Polymers are preferred which can be obtained by polymerization of hydroxyalkyl esters of acrylic acid or α-alkyl-substituted acrylic acids, or by copolymerization of these compounds with other vinyl compounds, for example, those mentioned above which do not react with the N-methylol or N-methylol ether groups of the compounds of the formula (II) to form reaction products containing vinyl groups.

In those cases in which, for example, polymers containing vinyl alcohol units or units of derivatives of vinyl alcohol are used for the preparation of the crosslinkable polymers, the polymers consist of carbon chains containing recurrent units of the formula (III):

(III) 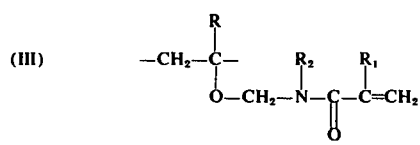

in which $R_1$ and $R_2$ have the same meaning as above; and R represents hydrogen or alkyl having up to 4 carbon atoms, preferably methyl.

The crosslinkable polymers derived from polymeric hydroxyalkyl acrylates comprise polymer chains containing recurrent units of the formula (IV):

(IV) 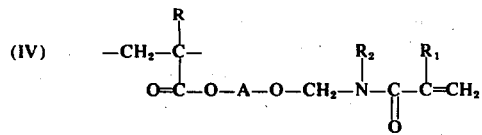

in which R, $R_1$ and $R_2$ have the meaning defined above; and A stands for a bivalent aliphatic radical which may be interrupted by oxygen atoms, such as ethylene, propylene, isopropylene, butylene, radicals of the formula $-(CH_2-CH_2-O)_m-CH_2-CH_2-$ where $m$ represents an integer of 1 or more than 1, preferably 1 to 3.

In some cases it may also be expedient to replace the hydroxyalkyl esters of acrylic acid or its derivatives completely or partially with acrylamide, methacrylamide, maleic imide or other monomers carrying amide or imide groups. Finally, it is also possible to react polymers carrying amino groups, such as are obtained e.g. by copolymerization of aminoethyl acrylate or aminoethyl methacrylate with other vinyl monomers.

For the production of the light-sensitive polymers a polymer reactant of the type described above is mixed with the unsaturated N-methylol compound and/or the unsaturated N-methylol ether, either directly or, preferably, in a solvent which is selected in accordance with the solubility of the components to be mixed. In the case of copolymers containing hydroxypropyl or hydroxyethyl acrylate or methacrylate, for example, ethyl acetate, methyl ethyl ketone, butyl acetate, glycol acetate monomethyl ether, are used as solvents.

The amount of vinyl compound (II) to be added depends on the number of reactive groups in the polymer; as a rule, it is equimolar or smaller, because an excess of vinyl monomer (II) in the mixture, although it does not impair the reactivity of the resultant polymer which can be cross-linked by vinyl polymerization, may lead to inhomogeneity or to an undesirable softness of the non-cross-linked layer, due to crystallization. However, deviations from this rule may be indicated in some cases, just as it may also be expedient to add to the system further monomeric vinyl compounds which do not react by transetherification.

To the mixture of vinyl compound (II) and polymer described above there are added according to the invention 0.01 – 5 percent by weight, preferably 0.1 – 1 percent by weight, referred to solids, of an acidic catalyst, for example, an organic sulfonic acid such as e.g. p-toluene-sulfonic acid; or a carboxylic acid such as, for example, malonic acid, maleic acid, oxalic acid, tartaric acid, trichloroacetic acid, dichloroacetic acid, cyclopropane-1,1-dicarboxylic acid, cyanoacetic acid. However, the process is in no way limited to these acids; further carboxylic acids as well as mineral acids such as HCl, phosphoric acid or sulfuric acid may also be used. In the case where the starting polymer already contains acidic functional groups such as carboxyl groups or sulfonic acid groups, such an addition may be dispensed with.

The condensation of the starting polymer with the added vinyl compound (II) normally starts with the addition of the acidic catalyst. This condensation is an equilibrium reaction: depending on the choice of solvent and the number of reactive groups in the polymer, only part of the vinyl compound (II) will be condensed with the reactive groups of the polymer in solution. However, complete conversion is achieved in any case when the mixture is applied to the desired support, and the liberated water and/or the alcohol liberated from the N-methylol ether evaporates with the solvent. Complete etherification or transetherification and thus condenzation of the vinyl compound (II) on to the polymer can already be achieved in solution if a solvent is chosen which permits, on account of its comparatively high boiling point, to distil off under reduced pressure at temperatures below 40°C the water or the alcohol liberated during condenzation. Suitable solvents are here, for example, methyl glycol acetate, ethyl glycol acetate and analogous compounds, but also higher ketones.

In a typical application of the process according to the invention, a vinyl monomer containing hydroxyl groups is first polymerized, either by itself or in combination with other vinyl monomers the proportion of which may amount to up to 90 percent by weight, in known manner in a solvent such as e.g. methyl ethyl ketone, isopropanol or ethyl acetate. The resultant polymer solution is cooled to room temperature and mixed with a catalytic amount of p-toluene-sulfonic acid. The amount of vinyl compound (II) corresponding to the number of hydroxyl groups is then added. Depending on the intended application, the mixture so obtained can be protected against premature crosslinking by means of one of the conventional polymerization inhibitors such as hydroquinone, toluhydroquinone, di-tert.-butylphenol, di-tert.-butyl-p-cresol or copper compounds. The amounts required for this purpose are within the conventional range and can be determined for the intended application by simple tests, i.e., by determination of the storability at elevated temperature or determination of the reactivity during the subsequent cross-linking process. As a rule, there are used amounts of 0 to 1 percent by weight.

In order to obtaine a sufficiently high light-sensitivity of the polymer layers, the usual photoinitiators are added in amounts of 0.1 – 10 percent by weight based on the photocrosslinkable polymer.

Suitable photoinitiators are described by J. C. BLOINGTON in "Radical Polymerization," published by Academic Press New York, 1961. Compounds of this kind include hydrazones, 5-membered nitrogen, containing heterocyclic rings, mercapto compounds, pyrylium or thiopyrylium salts, thiooxanthrones, dyestuff-redox systems, acridine and phenothiazine compounds as described for example in German Offenlegungsschrift No. 2,027,467.

Dimeres of lophine for example of 2,4,5-triphenylimidazole are also suitable. Compounds of this type are described in British patent specifications No. 997,396 and 1,047,569. Furthermore, α-phenylethyl alcohols may also be mentioned, as described in German Offenlegungsschrift No. 2,015,711. Reference is further made to polynuclear quinones such as anthraquinone, 2-methyl anthraquinone, 2-tert.-butyl anthraquinone, anthraquinone-2-carboxylic acid butylester, phenanthrenquinone. Suitable photoinitiators are also benzophenon derivatives such as described in British patent specification No. 1,242,988 or components of the benzoin series such as benzoin, benzoin ethers or hydroxy methyl benzoin which are described in British patent specifications No. 1,209,867; 1,229,082 or 1,265,604 or U.S. patent specifications No. 3,639,321; 3,657,088; 3,607,693 or 3,636,026. The photoinitiators can be used alone or in admixture with other initiators.

It may be advantageous to add further solvents, for example, for influencing the drying properties, plasticizers, coating aids, dyes or other fillers which should not absorb light of the spectral range of the light initiating the photopolymerization. Likewise, it may be expedient in some cases to add to the mixture further inert polymers and/or further mono- or polyfunctional vinyl compounds.

The solution so obtained is applied to the desired layer support by means of dipping, spraying, pouring, rolling, whirling or by another conventional method of application. After evaporation of the solvent which may be carried out at an elevated temperature, for example, at 80°C, there is obtained a dry, tack-free film.

The resultant soluble film can be cross-linked, upon exposure to actinic light either directly or after it has been transferred to the final support. In contrast to the light-sensitive polymer hitherto used which can be cross-linked by vinyl polymerization, the layers according to the invention make it possible to dispense with the use of a protective foil and with working in an oxygen-free atmosphere.

After exposure the unexposed parts can be dissolved e.g. with an organic solvent and washed off. Suitable solvents for this purpose are particularly those which may also be used for application of the layer but practically any solvents in which the uncross-linked polymer is soluble and the exposed areas of the layer are insoluble may also be used, such as chlorinated hydrocarbons, higher alcohols, esters or aromatic hydrocarbons. If the polymers contain water-solubilizing groups, e.g. carboxyl groups, the unexposed areas can be washed off which aqueous solvents such as diluted aqueous solutions of alkalimetal hydroxides, carbonates, phosphates or buffering solutions. The cross-linked insoluble portions of the layer adhere to the layer support and resist all the customary etching solutions such as dilute nitric acid and iron-III chloride solutions as well as metal deposition in the usual baths.

Suitable layer supports are metal foils of copper, aluminum, zinc, magnesium, steel and the like, paper, glass, or foils of polymers, such as cellulose esters, polyvinyl acetate, polyphenylolalkanes, polyesters, especially those based on polyethylene terephthalate, polyamides, e.g. nylon. Materials which have a mesh structure such as metal mesh may also be used as supports. With suitable polymers it is also possible to produce selfsupporting layers.

The photocrosslinkable layers according to the invention may be used for the production of relief images or printing forms for relief printing, intaglio printing or planographic printing. They may be used especially for offset printing processes, screen printing processes, lithographic printing plates or any other printing processes which require a relief image as well as photogravure processes. The layers according to the invention are also suitable for the production of photoresists to make printed circuits, etched mouldings, mouldings by the electro-forming process and integrated microcircuits.

Exposure of the layers produced according to the invention is carried out with the usual sources of light used in reproduction work, such as carbon arc lamps, Xenon lamps and high pressure mercury lamps which advantageously provide a particularly effective portion of ultraviolet light for polymerization in addition to visible light.

The cross-linking reaction may be initiated not only by light. Other high energy radiation such as that of electron rays, X-rays and γ-rays may also be used.

Moreover, it is possible thermally to transfer the finished relief image to a suitable support in a particularly simply way after imagewise exposure and development.

EXAMPLE 1

Production of the polymer 868 g ethyl acetate were heated in a nitrogen atmosphere under reflux in a three-neck flask of 2 liters capacity fitted with stirrer, reflux condenzer and dropping funnel. A mixture of 288 g methacrylic acid hydroxypropyl ester, 150 g methyl methacrylate, 150 g ethyl acrylate and 9 g azo-isobutyric acid dinitrile were added dropwise within 3 hours. When the dropwise addition was completed, there was added 1 g azo-isobutyric acid dinitrile in 10 g ethyl acetate, and heating under reflux was continued for a further 5 hours. The ethyl acetate was partially distilled off, and the highly viscous polymer solution was concentrated by evaporation in a vacuum drying cabinet at 15 mm/50°C for 24 hours to give a solid colorless resin (580 g).

234 g of this resin, 800 mg p-toluene-sulfonic acid and 60 mg hydroquinone were dissolved in 300 g glycol acetate monomethyl ether. 80 g N-methylol-acrylamide dissolved in 200 g methanol were added to this solution at room temperature, and this mixture was stirred at room temperature in a water jet vacuum for 3 hours, methanol and the liberated reaction water being thus evaporated off.

LIGHT-SENSITIVE MATERIAL

A solution of the polymer prepared in this way is diluted with glycol acetate monomethyl ether to 30 percent by weight and sensitized with 2 percent by weight, referred to the dry film-forming polymer, of 2-tert.-butyl-anthraquinone. A clean copper sheet was coated with this solution by means of a whirling coater at 200 r.p.m. and dried at room temperature for 8 hours. The dried layer had a thickness of 25μ.

PROCESSING

The above layer is exposed for 4 minutes in a Chem-Cut vacuum frame through a 0.15 grey step wedge. Development with ethyl acetate/i-propanol gives a sharp relief image of 9 steps of the test wedge.

On account of its good thermoplastic properties, the product prepared and sensitized as described above, after coating and drying, is excellently suitable for transfer from a carrier foil (e.g. Hostaphan RHH 30) to another support by means of hot rollers at 120°C. After imagewise exposure through a line pattern and subsequent development, a sharp relief image of the pattern is obtained.

Moreover, the relief image can also be transferred, after exposure and development, in exactly the same manner.

EXAMPLE 2

Preparation of the polymer 150 g methyl ethyl ketone were refluxed in a nitrogen atmosphere in a three-neck flask of 1 liter capacity fitted with stirrer, reflux condenzer and dropping funnel. A mixture of 108 g hydroxypropyl methacrylate, 32 g butyl acrylate and 2.1 g azo-isobutyric acid dinitrile was added dropwise within 1½ hours. When the dropwise addition was completed, there were added a further 0.2 g azo-isobutyric acid dinitrile and heating was continued under reflux for a further 2 hours. The solvent was then partially evaporated, and the highly viscous polymer solution was concentrated by evaporation in a vacuum drying cabinet at 15 mm/50°C for 24 hours to form a solid colorless resin (135 g). The dry resin, 700 mg p-toluene-sulfonic acid and 50 mg hydroquinone were dissolved in 180 g methyl glycol acetate and mixed at room temperature with 86 g N-methoxymethyl-acrylamide.

LIGHT-SENSITIVE MATERIAL

The resin solution was sensitized with 2 percent by weight based on the dry film-forming polymer, of 2-tert.-butyl-anthraquinone and colored with 0.5 percent by weight of waxoline rhodamine.

PROCESSING

Coating at 0.5 m per minute on to a polyester foil of 36μ thickness yielded, after drying, layers of a thickness of 40μ. These could be thermally transferred at 120°C to a clean copper foil. After imagewise exposure and development in i-propanol, there resulted sharp relief images of the pattern.

EXAMPLE 3

A polymer was prepared in analogy with Example 2 from
 65 g hydroxyethyl methacrylate
 75 g methyl methacrylate
 40 g acrylonitrile
in 180 g ethyl methyl ketone and this was dried in a vacuum.

150 g of the solid polymer were dissolved in 150 g methyl glycol acetate and, after the addition of 480 mg p-toluene-sulfonic acid and 190 mg 2,6-di-tert.-butyl-p-cresol. mixed with 48 g N-methoxymethyl-acrylamide, sensitized as described in Example 1, and used for the production of a relief image.

EXAMPLE 4

A polymer was prepared in analogy with Example 2 from
 144 g hydroxypropyl methacrylate
 75 g ethyl acrylate
 78 g styrene
in 300 g toluene. 119 g of the resultant solution in toluene were mixed with 23 g N-methoxymethyl-acrylamide, 0.2 g p-toluene-sulfonic acid and 0.074 mg di-tert.-butyl-p-cresol, sensitized as described in Example 1, and used for the production of a relief image.

EXAMPLE 5

60 g of the solid solvent-free polymer of Example 1 were dissolved in 60 g methyl ethyl ketone and mixed in succession with 0.2 g p-toluene-sulfonic acid, 0.074 g di-tert-butyl-p-cresol and 25.9 g N-methoxymethyl-methacrylamide. After being sensitized with tert.-butyl-anthraquinone, also this mixture can be successfully used for the production of a relief image as described in Example 1.

EXAMPLE 6

60 g of the solid solvent-free polymers of Example 1 were dissolved in 60 g methyl ethyl ketone and mixed in succession with 0.25 g oxalic acid, 0.074 g di-tert.-butyl-p-cresol and 24.5 g N-methoxymethyl-acrylamide. The solution is sensitized with 2 percent by weight, referred to the dry film-forming polymer, of 2-tert.-butyl-anthraquinone and whirled on to a copper plate as described in Example 1. After drying at 100°C for 15 minutes and exposure through a pattern, a relief image was obtained.

EXAMPLE 7

500 g methyl glycol acetate were heated in a nitrogen atmosphere at 110°C in a three-neck flask of 2 liter capacity fitted with stirrer, reflux condenzer and dropping funnel. A mixture of 142 g acrylamide, 150 g methyl methacrylate, 150 g ethyl acrylate and 15 g benzoyl peroxide was added dropwise within 6 hours, and the mixture was kept at 110°C for a further 2 hours. The alightly turbid polymer solution was allowed to cool down and subsequently dried in a vacuum drying cabinet at 60°C/12 mm (440 g).

110 g of this polymer were dissolved in 150 g dimethyl formamide, mixed in succession with 250 mg p-toluene-sulfonic acid, 23 g N-methoxymethyl-acrylamide, 100 mg 2,6-di-tert.-butyl-p-cresol and 6 g 2-chloromethyl-anthraquinone, and the mixture was homogenized.

The resultant solution was applied on to a metal plate to form a film of 200 μ thickness. The film was dried at 50°C/12 mm for 18 hours and subsequently exposed through a pattern as described in Example 1. After development with methyl glycol acetate, a sharp relief image of the pattern was obtained.

EXAMPLE 8

A polymer was prepared as described in Example 2 from
 67.8 g maleic imide
 70.0 g methyl methacrylate 89.6 g butyl acrylate
in 300 g methyl ethyl ketone and this was dried in a vacuum.

The polymer was dissolved in 250 g methyl glycol acetate and, after the addition of 800 mg p-toluene-sulfonic acid and 80 mg hydroquinone, mixed with 77 g N-methoxymethyl-acrylamide, sensitized as described in Example 1, and used for the production of a relief image.

EXAMPLE 9

500 g ethyl acetate were refluxed in a nitrogen atmosphere in a three-neck flask of 2 liters capacity fitted with stirrer, reflux condenzer and dropping funnel. A mixture of 288 g hydroxypropyl-methacrylate, 150 g methyl methacrylate, 150 g ethyl acrylate, 45 g acrylic acid and 4.5 g azo-butyric acid dinitrile was added within 1 hour. After this period of time, 0.5 g azo-isobutyric acid dinitrile in 40 g ethyl acetate were added dropwise within a further hour. After a further 2 hours under reflux, the mixture was cooled to room temperature and 1 g 2,6-di-tert.-butyl-p-cresol, 2 g p-toluene-sulfonic acid and 230 g N-methoxymethyl-acrylamide were successively added to the polymer solution. This solution was sensitized with tert.-butyl-anthraquinone as described in Example 1 and used for the production of a relief image. The unexposed areas are washed off with a 2 percent aqueous solution of sodium carbonate. A corresponding experiment without the use of p-toluene-sulfonic acid yielded solvent-resistant relief images after a drying time of 3 days at 40° C.

EXAMPLE 10

100 g of a saturated polyester derived from phthalic acid and trimethylol-propane with an acid number of 3 and an OH number of 263 (viscosity of a 50 percent by weight solution in ethyl acetate: 850 cp) were dissolved in 100 g methyl glycol acetate and homogenized in succession with 200 mg p-toluene sulfonic acid, 50 mg hydroquinone and 54 g N-methoxymethyl-acrylamide at room temperature. This solution was mixed with 2 g benzoin isopropyl ether and applied to a metal plate as a layer of 200 μ thickness. After drying at 40° C/12 mm for 18 hours, tack-free coating was obtained which, when exposed through a pattern according to Example 1 and developed, yielded a sharp relief image.

We claim:

1. A process for the production of photographic relief images or photoresists comprising the steps of imagewise exposing a supported light-sensitive material with a photocrosslinkable polymer in the layer, washing away the unexposed areas of the photosensitive layer to form a relief image of photocrosslinked polymeric material the improvement wherein the said photocrosslinkable polymer compound is a photopolymer of recurrent units of the general formula

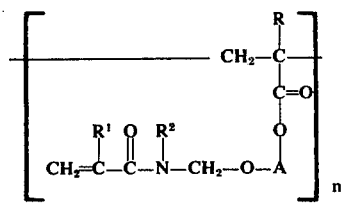

wherein
R stands for hydrogen or alkyl having up to 4 carbon atoms and
$R^1$ represents hydrogen or alkyl having up to 4 carbon atoms,
$R^2$ stands for hydrogen or alkyl having up to 8 carbon atoms, and
A represents a divalent aliphatic bridging member having 2-4 carbon atoms or a bridging member of the formula
$-(CH_2-CH_2-O)_m-CH_2-CH_2-$
wherein m represents an integer of 1 to 3,
n is 2 or more,
wherein the photopolymer is either a homopolymer or a copolymer with comonomers selected from the group consisting of vinyl monomers, vinyl esters, vinyl ethers, acrylic and methacrylic acid and their derivatives, maleic acid anhydride, and styrene and the light-sensitive polymer has an average molecular weight of between 10,000 and 100,000.

2. The process of claim 1, in which the polymer comprises at least two of the said units of formula per 1000 units of molecular weight.

* * * * *